(12) United States Patent
Gelhausen et al.

(10) Patent No.: US 11,011,886 B2
(45) Date of Patent: May 18, 2021

(54) PACKAGING OF A DIRECTLY MODULATED LASER CHIP IN PHOTONICS MODULE

(71) Applicant: INPHI CORPORATION, Santa Clara, CA (US)

(72) Inventors: Frank Gelhausen, Langenhagen (DE); Ahmed Sanaa Ahmed Awny, Langenhagen (DE); Edward Pillai, Langenhagen (DE); Ulrich Schacht, Langenhagen (DE); Oliver Piepenstock, Langenhagen (DE)

(73) Assignee: INPHI CORPORATION, San Jose, CA (US)

( * ) Notice: Subject to any disclaimer, the term of this patent is extended or adjusted under 35 U.S.C. 154(b) by 0 days.

(21) Appl. No.: 16/802,438

(22) Filed: Feb. 26, 2020

(65) Prior Publication Data

US 2020/0194969 A1    Jun. 18, 2020

Related U.S. Application Data

(63) Continuation of application No. 15/896,955, filed on Feb. 14, 2018, now Pat. No. 10,615,567.

(51) Int. Cl.
*H01S 5/024* (2006.01)
*G02B 6/42* (2006.01)
*H05K 1/02* (2006.01)
*H04B 10/50* (2013.01)
(Continued)

(52) U.S. Cl.
CPC ........ *H01S 5/02415* (2013.01); *G02B 6/4266* (2013.01); *H01S 5/0224* (2013.01); *H01S 5/04256* (2019.08); *H04B 10/504* (2013.01); *H05K 1/0204* (2013.01); *G02B 6/4271* (2013.01); *H01S 5/0226* (2013.01); *H01S 5/02276* (2013.01)

(58) Field of Classification Search
None
See application file for complete search history.

(56) References Cited

U.S. PATENT DOCUMENTS

| 10,025,047 B1* | 7/2018 | Liu ...................... G02B 6/4243 |
| 2003/0095736 A1* | 5/2003 | Kish, Jr. ............ G02B 6/12007 385/14 |

(Continued)

*Primary Examiner* — Steven B Gauthier
(74) *Attorney, Agent, or Firm* — Richard T. Ogawa; Ogawa P.C.

(57) ABSTRACT

A package structure of a directly modulated laser in a photonics module includes a thermoelectric cooler including multiple conductor traces formed in a cool surface. The package structure further includes a directly modulated laser (DML) chip having a first electrode being attached with the cool surface and a second electrode at a distance away from the cool surface. Additionally, the package structure includes an interposer having a plurality of through-holes formed between a first surface to a second surface. The first surface is mounted to the cool surface such that each through-hole is aligned with one of the multiple conductor traces and the second surface being leveled with the second electrode. Moreover, the package structure includes a driver disposed on the second surface of the interposer with at least a galvanically coupled output port coupled directly to the second electrode of the DML chip.

5 Claims, 5 Drawing Sheets

(51) Int. Cl.
*H01S 5/022* (2021.01)
*H01S 5/042* (2006.01)

(56) References Cited

U.S. PATENT DOCUMENTS

| | | | |
|---|---|---|---|
| 2004/0101006 A1* | 5/2004 | Iwafuji | H01S 5/02252 372/36 |
| 2007/0079980 A1* | 4/2007 | Kononenko | H02M 7/003 173/90 |
| 2019/0052063 A1* | 2/2019 | Tolstikhin | H01S 5/02446 |

* cited by examiner

—Prior Art—

PACKAGING OF A DIRECTLY MODULATED LASER CHIP IN PHOTONICS MODULE

CROSS-REFERENCE TO RELATED APPLICATIONS

This application is a continuation of and claims priority to U.S. application Ser. No. 15/896,955, filed Feb. 14, 2018, commonly assigned and incorporated by reference herein for all purposes.

BACKGROUND OF THE INVENTION

The present disclosure is related to a photonic package structure, more particularly, to a package structure for disposing a flip-chip driver directly on a substrate or via an interposer to have a galvanically coupled output directly connected to a directly modulated laser (DML) chip with minimized inductance in a photonics transceiver module.

As science and technology are progressing rapidly, processing speed and capacity of the computer increase correspondingly. The communication transmission or reception using the traditional cable is limited to bandwidth and transmission speed of the traditional cable, but the mass information transmission required in modern life causes the traditional communication transmission overload. To address such requirements, the optical fiber transmission system replaces the traditional communication transmission system gradually. The optical fiber transmission system does not have bandwidth limitation, and also has advantages of high speed transmission, long transmission distance, its material is impervious to electromagnetic waves. Therefore, the electronics industry performs research toward optical fiber transmission which will become the mainstream in the future. Said optical communication is a technology in that light waves function as signal carriers and transmitted between two nodes via the optical fiber. Field of optical communication can be divided into optical communication side and electric communication side according to transmission medium. A key component of the optical communication side is optical transceiver which is configured to receive optical signals coming from optical fibers and convert to electrical signals capable of being processed by an IC, or to use a modulated laser chip to generate optical signals based on electrical signals and transmit the optical signals via optical fibers.

A state-of-art optical transceiver module is integrated with silicon photonics technology and packaged in a compact photonics module. In the photonics module, a directly modulated laser (DML) chip is usually coupled with a driver chip to receive control signals for generating optical signals to be transmitted into the optical fibers. FIG. 1 shows a schematic diagram of a driver chip being coupled with a DML chip via wirebonds according to a conventional packaging scheme. The wirebond, however, has high inductance, which distorts the current signal flowing into the DML. For example, a mere 200 pH inductance caused by a wirebond can substantially distort PAM-4 signal eye diagrams for ≥25 Gbaud rate data transmission. Therefore, an improved packaging technique is desired for coupling the driver chip with the DML chip. This does also potentially lower the power dissipation since electric circuitry required for signal conditioning might be omitted.

BRIEF SUMMARY OF THE INVENTION

The present disclosure is related to a photonic package structure, more particularly, to a package structure for disposing a flip-chip driver directly on a substrate or via an interposer with a galvanically coupled output directly connected to a directly modulated laser (DML) chip in a photonics transceiver module. In certain embodiments, the invention is applied for packaging photonics module for high data-rate optical communication, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Stacking chips into so-called 3-D ICs promises a one-time boost in their capabilities, but it's very expensive. Another way to achieve this goal in this disclosure is to use multiple chip module technology.

In an example, an alternative method to increase the bandwidth is to move the optical devices close to electrical device. Silicon photonics is an important technology for moving optics closer to silicon. In this patent application, we will disclose a high speed electrical optics multiple chip module device to achieve terabits per second speed, as well as variations thereof.

In a specific embodiment, the present disclosure provides a package structure of a directly modulated laser in a photonics module. The package structure includes a thermoelectric cooler having a cool surface including multiple conductor traces formed in the cool surface. The package structure further includes a directly modulated laser (DML) chip having a common electrode attached to the cool surface and one or more separate electrodes at a distance away from the cool surface. Additionally, the package structure includes an interposer having a plurality of through-holes formed from a first surface of the interposer to a second surface of the interposer. The first surface is mounted to the cool surface such that each through-hole is aligned with one of the multiple conductor traces and the second surface is leveled with a first separate electrode of the one or more separate electrodes. Furthermore, the package structure includes a driver chip disposed on the second surface of the interposer. The driver chip has a first galvanically coupled output port to be coupled directly to the first separate electrode of the DML chip.

In another specific embodiment, the present disclosure provides a package structure of a directly modulated laser in a photonics module. The package structure includes a substrate configured as a thermoelectric cooler including multiple conductor traces embedded in a first surface. The first surface has a cavity region including a second surface. Additionally, the package structure includes a directly modulated laser (DML) chip having a first electrode attached to the second surface within the cavity region and at least one second electrode positioned to be leveled with the first surface. Furthermore, the package structure includes a driver chip flipped and disposed on the substrate. The driver chip includes multiple electrodes configured to be coupled with the multiple conductor traces in the first surface and includes at least one galvanically coupled output port to be coupled directly to the at least one second electrode of the DML chip.

In yet another specific embodiment, the present disclosure provides a method of packaging a directly modulated laser in a photonics module. The method includes providing a thermoelectric cooler having a cool surface including multiple conductor traces formed in the cool surface. Additionally, the method includes disposing a directly modulated laser (DML) chip having a first electrode attached to the cool surface and one or more separate electrodes at a distance away from the cool surface. The method further includes mounting an interposer on the cool surface. The interposer has a plurality of through-holes formed from a first surface to a second surface thereof. The first surface of the interposer is attached to the cool surface such that each through-hole is aligned with one of the multiple conductor traces and the second surface of the interposer is leveled with a first separate electrode of the one or more separate electrodes. Furthermore, the method includes disposing a driver chip flipped on the second surface of the interposer with a first galvanically coupled output port being coupled directly to the first separate electrode of the DML chip.

In still another specific embodiment, the present disclosure provides a method of packaging a directly modulated laser in a photonics module. The method includes providing a substrate configured as a thermoelectric cooler including multiple conductor traces embedded in a first surface. The first surface has a cavity region including a second surface. Additionally, the method includes disposing a directly modulated laser (DML) chip having a first electrode attached to the second surface within the cavity region and at least one second electrode positioned to be leveled with the first surface. Furthermore, the method includes disposing a driver chip flipped on the substrate such that multiple electrodes are coupled to the multiple conductor traces in the first surface and at least one galvanically coupled output port is coupled directly to the at least one second electrode of the DML chip.

Therefore, the present disclosure has at least following advantages. First, the package structure for coupling a galvanically coupled output of a flip-chip driver to a directly modulated laser (DML) chip in a photonics transceiver module substantially increasing the transmitter bandwidth without wirebond to eliminate unwanted noise source due to parasitic inductance. Secondly, the DML chip used in the photonics transceiver module can be advantageously made with a common-electrode configuration.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
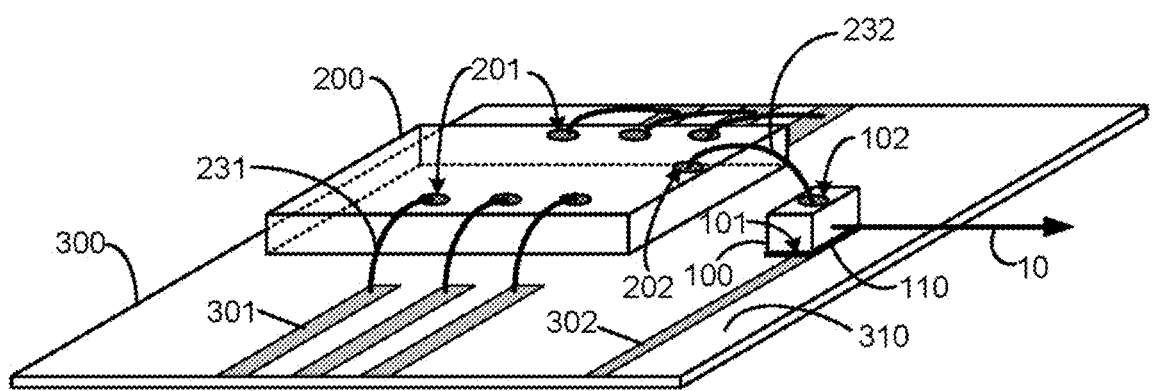
FIG. 1 is a schematic diagram of a driver chip being coupled with a DML chip via wirebonds according to a conventional packaging scheme.

The present disclosure is related to a photonic package structure, more particularly, to a package structure for disposing a flip-chip driver directly on a substrate or via an interposer with a galvanically coupled output directly connected to a directly modulated laser (DML) chip in a photonics transceiver module. In certain embodiments, the invention is applied for packaging photonics module for high data-rate optical communication. For example, the DML chip is installed in a TEC-TOSA laser device in a pluggable photonic transceiver in Quad Small Form-factor Pluggable (QSFP) packaging specification. Other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a schematic diagram of a driver chip being coupled with a DML chip via wirebonds according to a conventional packaging scheme. As shown, a thermoelectric cooler 300 is provided and configured with multiple conductor traces 301 formed on a cool surface 310. The DML chip 100 is disposed on the cool surface 310. Optionally, the DML chip 100 includes an electrode 101 attached to the cool surface 310 to connect a conductor trace 302 for electrical grounding. A thermal conductive pad 110 is inserted between the electrode 101 and the cool surface 310. The DML chip 100 also has another electrode 102 at a distance above the cool surface 310 opposing to the electrode 101. A driver chip 200 is disposed on the cool surface 310 too. The driver chip 200 includes multiple electrodes 201 and at least a galvanically coupled output port 202 configured to provide control signals and drive currents to both the thermoelectric cooler 300 and the DML chip. In the conventional packaging scheme, the electrical coupling between each of the multiple electrodes 201 of the driver chip 200 and one of the multiple conductor traces 301 of the thermoelectric cooler 300 is realized by a wirebond 231. Also, the electrical coupling between the galvanically coupled output port 202 of the driver chip 200 and the electrode 102 of the DML chip 100 is realized via a wirebond 232. The control currents delivered to the DML chip 100 are able to drive the DML to generate modulated laser signals 10 that are configured to be transmitted through optical fibers (not shown). However, due to a parasitic inductance caused by the wirebond 232, the modulated laser signals generated by DML in such a package structure are likely affected by inter-symbol-interference (ISI) and noises induced by the high inductance such that the eye diagrams for 25 Gbaud or higher rate data transmission are distorted even with an inductance of 200 pH induced by the wirebond.

Figure 2:
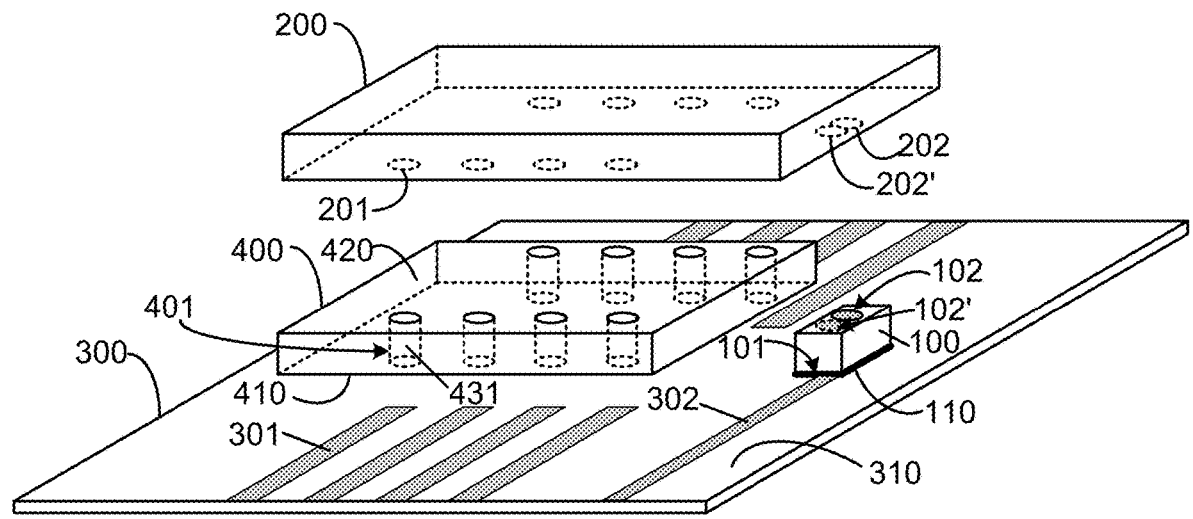
FIG. 2 is an exploded view of a package structure of a DML chip coupled with a flip-chip driver according to an embodiment of the present invention.
Figure 3:
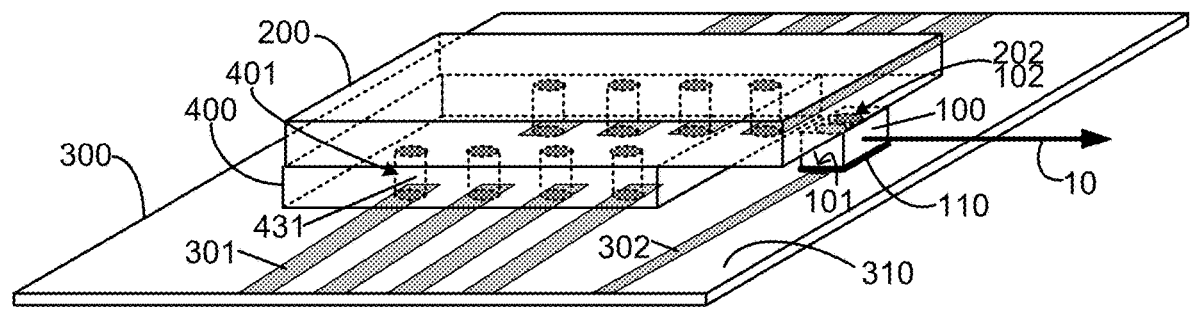
FIG. 3 is a perspective view of the package structure of a DML chip in photonics module according to the embodiment of the present invention.

In this disclosure, an improved package structure for coupling the DML with the driver is provided to eliminate parasitic inductance induced by the wirebond. FIG. 2 is an exploded view of a package structure of a DML chip coupled with a flip-chip driver according to an embodiment of the present invention. FIG. 3 is a perspective view of the package structure of a DML chip in photonics module according to the embodiment of the present invention. This diagram is merely an example, which should not unduly limit the scope of the claims. One of ordinary skill in the art would recognize many variations, alternatives, and modifications.

Referring to FIG. 2, the thermoelectric cooler 300 is still provided as a plate with a surface 310 and multiple conductor traces 301 and 302 embedded in the surface 310. The multiple conductor traces 301 are configured to carry electrical signals interfacing the driver chip 200. The directly modulated laser (DML) chip 100 is configured with a common electrode 101 attached to the cool surface 310. The conductor trace 302 is configured to couple with the common electrode 101 providing electrical ground for the DML chip 100. Optionally, as shown in FIG. 3, a thermal conductive pad 110 is inserted between the common electrode 101 and the cool surface 310. The DML 100 also includes at least an electrode 102 positioned at a distance away from the cool surface. Optionally, the at least one electrode 102 is formed opposing to the electrode 101 in its own package of DML chip 100. Optionally, the DML chip 100 includes multiple laser diodes having the common electrode 101 and multiple separate electrodes, such as the at least one electrode 102 of one laser diode and a separate electrode 102' of a separate laser diode. The multiple electrodes are all positioned opposing to the common electrode 101 at a distance away from the cool surface 310.

Referring to FIG. 2, an interposer 400 is designed to be mounted on the cool surface 310. The interposer 400 includes multiple through-holes 401 formed through a body of plate from a first surface 410 to a second surface 420. The body of plate of the interposer 400 comprises silicon and silicon oxide material. Each of the multiple through-holes 401 is a through-silicon via (TSV) configured to be aligned with one of the multiple conductor traces 301 in the cool surface 310. Optionally, each TSV 401 can be formed by filling a conductor material 431 therein. Optionally, any material with low resistance and low inductance may be used as the conductor material 431. Optionally, the body of plate comprises a height that can be substantially equal to the distance between the at least one electrode 102 and the common electrode 101 of the DML chip 100. In the embodiment, as shown in FIG. 3, when the interposer 400 is disposed onto the cool surface 310, the first surface 410 is attached with the cool surface 310 and the second surface 420 is substantially leveled with the at least one electrode 102 of the DML chip 100 disposed on the cool surface 310. Additionally in the same package structure (FIG. 3), the conductor material 431 filled in each TSV 401 at the first surface 410 is electrically coupled with one of the multiple conductor traces 301 at the cool surface 310 of the thermoelectric cooler 300. Optionally, the electrical coupling between the conductor material 431 and the conductor trace 301 is formed by soldering a bump of the conductor material 431 formed at the first surface 410 directly with a pad of the conductor trace 301. Of course, other variations in packaging process can be implemented without altering the claims in the present disclosure.

Referring to FIG. 2 again, additionally, a driver chip 200 is provided as a flip-chip driver with multiple electrodes 201 and at least one galvanically coupled output port 202 facing toward the interposer 400 and the DML chip 100. Each of the multiple electrodes 201 is aligned with one of multiple through-holes 401 of the interposer 400 while the at least one galvanically coupled output port 202 is aligned with the at least one electrode 102 of the DML chip 100. As shown in FIG. 3, when the flip-chip driver 200 is disposed onto the interposer 400, the galvanically coupled output port 202 is directly coupled with the at least one electrode 102 of the DML chip 100, eliminating usage of any wirebond between them and in turn minimizing induced inductance thereof. Thus, the modulated laser signal 10 outputted from the DML chip 100 can be substantially free of distortions in the transmission eye diagram due to the parasitic inductance. Additionally shown in FIG. 3, each of the multiple electrodes 201 of the flip-chip driver 200 forms an electrical connection with the conductor material 431 soldering a bump of the electrode 201 and a bump of the conductor material 431 at the second surface 420, also eliminating usages of wirebonds and potential extra noises that affect the signal transmission of the photonics module.

Figure 4:
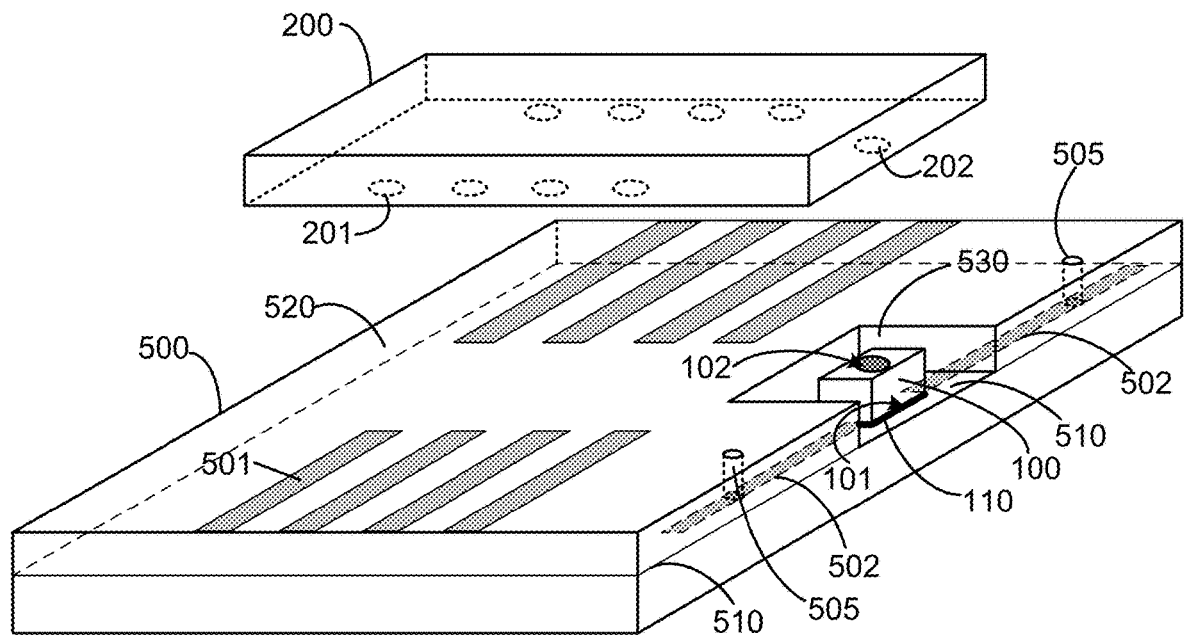
FIG. 4 is an exploded view of a package structure of a DML chip coupled with a flip-chip driver according to another embodiment of the present invention.
Figure 5:
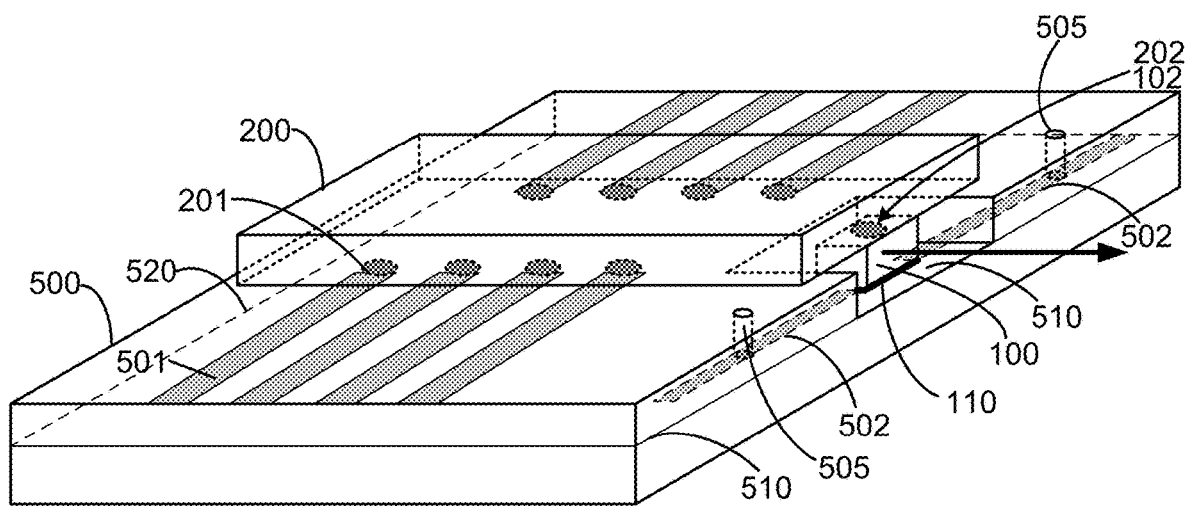
FIG. 5 is a perspective view of the package structure of a DML chip in a photonics module according to the embodiment of the present invention.

FIG. 4 is an exploded view of a package structure of a DML chip coupled with a flip-chip driver according to another embodiment of the present invention. FIG. 5 is a perspective view of the package structure of a DML chip in photonics module according to the embodiment of the present invention. This diagram is merely an example, which should not unduly limit the scope of the claims. One of ordinary skill in the art would recognize many variations, alternatives, and modifications. As shown, a substrate 500 is provided in this package structure. The substrate 500 is configured to be a thermoelectric cooler including multiple conductor traces 501 embedded in a first surface 520. The first surface 520 includes a cavity region 530 including a second surface 510 at a distance below the first surface 520. In the embodiment, the multiple conductor traces 501 are configured to carry electric signals interfacing the driver IC. Optionally, the substrate 500 is a circuit board made by thermal conductive and electrical insulate material and attached on top of a cool surface 510 of a thermoelectric cooler (TEC). Effectively the second surface 510 is the same surface as the cool surface of the TEC. Optionally, the cool surface 510 of the TEC includes one or more conductor traces 502 to have the cool surface 510 being configured to be an electric ground surface. The trace 502 is an electric ground trace. After the substrate 500 is attached on top of the cool surface 510, the cavity region 530 still reveals a portion of the cool surface 510 where it can be used for mounting a laser chip.

Referring to FIG. 4 and FIG. 5, a directly modulated laser (DML) chip 100 is disposed directly on the cool surface 510 that is still revealed within the cavity 530. An electrode 101 of the DML chip 100 is attached onto the cool surface 510. In the embodiment, the electrode 101 is configured to be a common electrode on one side of the DML chip 100. While on another side of the DML chip 100 at a distance opposing the side for the common electrode 101, at least one electrode 102 is formed. When the common electrode 101 is attached to the cool surface 510, the at least one electrode 102 at the other side is substantially leveled with the first surface 520 of the substrate 500. Optionally, the common electrode 101 is electrically connected to the conductor trace 502, i.e., connected to the electric ground. Optionally, the conductor trace 502 is part of the cool surface 510 and one or more through hole 505 is formed through the substrate 500 and filled with conductive material to form a TSV electrical connection 505 from the top surface of the substrate 500 to the conductor trace 502. The top spot of the TSV electrical connection 505 is for grounding the conductor trace 502 formed on the cool surface 510. Optionally, a thermal conductive pad 110 is inserted between the common electrode 101 and the cool surface (second surface) 510 in the cavity region 530. Optionally, although not shown in the FIG. 4 and FIG. 5, the DML chip 100 can include multiple laser diodes having the common electrode 101 and multiple separate electrodes 102 at the distance above the second surface 510 to be leveled with the first surface 520 of the substrate 500.

Referring to FIG. 4, a driver chip 200 is provided as a flip-chip driver with multiple electrodes 201 and at least one galvanically coupled output port 202 formed on a surface facing toward the first surface 520 of the substrate 500. In the embodiment, each of the multiple electrodes 201 is configured to be aligned with one of the conductor traces 501 in the first surface 520 while the at least one galvanically coupled output port 202 is aligned with the at least one electrode 102 of the DML chip 100 installed in the cavity region 530. As shown in FIG. 5, when the flip-chip driver 200 is disposed onto the substrate 500 with each of the multiple electrodes 201 electrically coupled with one of the multiple conductor traces 501 in the first surface 520, the at least one galvanically coupled output port 202 forms an electrical connection with the at least one electrode 102 of the DML chip 100. This package structure eliminates the use of wirebond between the galvanically coupled output port 202 and the electrode 102 of the DML chip, substantially minimizing the induced parasitic inductance and preventing it from causing distortion of the eye diagram of modulated laser signals generated by the DML chip for high rate data transmission.

Figure 6:
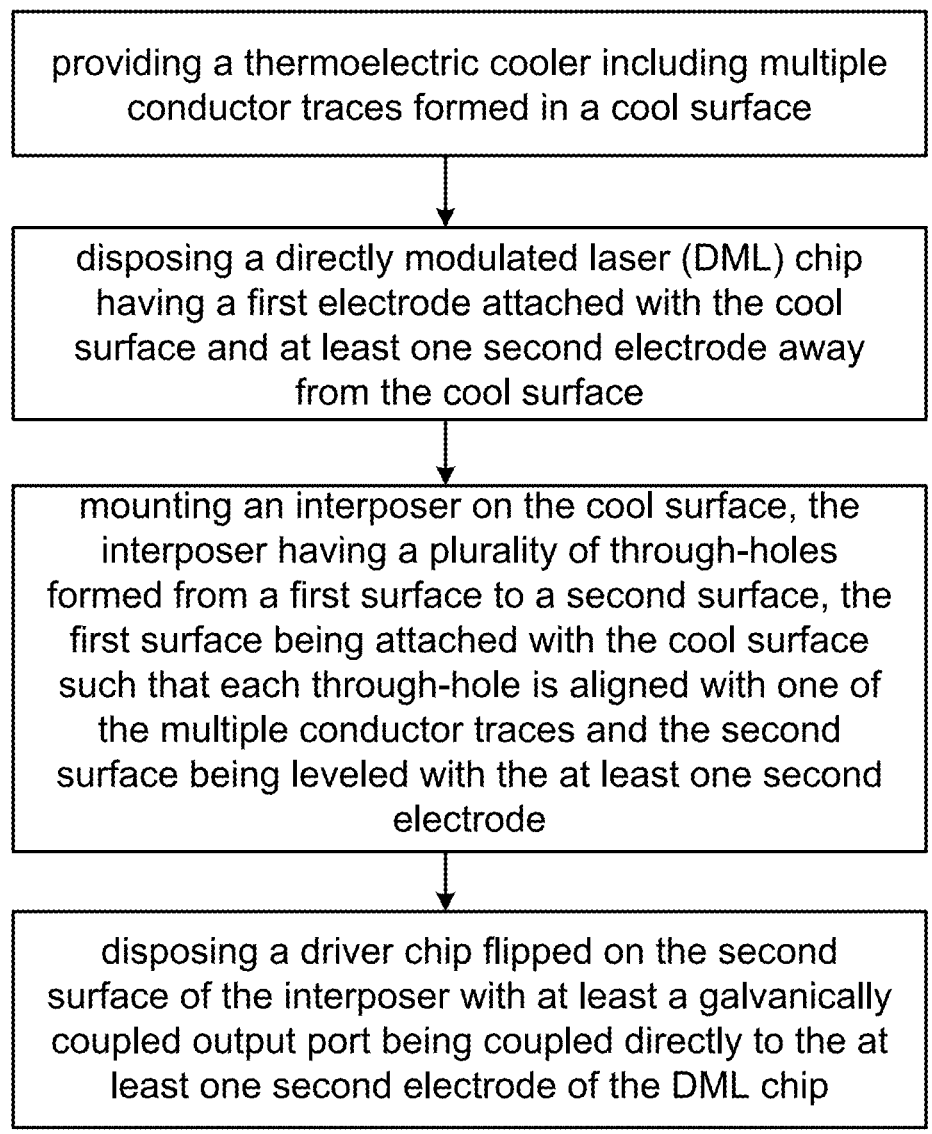
FIG. 6 is a flow chart illustrating a method of packaging a DML chip in photonics module according to an embodiment of the present invention.

In another aspect, the present disclosure provides a method of packaging a directly modulated laser (DML) chip in a photonics module. FIG. 6 is a flow chart illustrating a method of packaging a DML chip in photonics module according to an embodiment of the present invention. This diagram is merely an example, which should not unduly limit the scope of the claims. One of ordinary skill in the art would recognize many variations, alternatives, and modifications. As shown, the method includes execution of several steps. The method includes a step of providing a thermoelectric cooler including multiple conductor traces formed in a cool surface. Optionally, the thermoelectric cooler is a flat plate with a top surface being configured as a cool surface provided that the multiple conductor traces receive control signals or drive currents from a driver to operate the thermoelectric cooler properly. The method further includes a step of disposing a DML chip having a common electrode attached with the cool surface and at least one second electrode a distance away from the cool surface opposed to the common electrode. Optionally, the DML chip includes multiple laser diodes having a common electrode being attached with the cool surface and multiple separate second electrodes at the same distance opposing to the common electrode. Additionally, the method includes a step of mounting an interposer on the cool surface. The interposer includes a plurality of through-holes formed from a first surface to a second surface and the first surface is attached with the cool surface such that each through-hole is aligned with one of the multiple conductor traces. Optionally, a conductor material is filled in the through-hole and is formed an electrical connection at the first surface with the conductor trace in the cool surface of the thermoelectric cooler. The second surface of the interposer is substantially leveled with the at least one second electrode (or multiple separate second electrodes) of the DML chip. Furthermore, the method includes a step of disposing a driver chip flipped on the second surface of the interposer with at least a galvanically coupled output port being coupled directly to the at least one second electrode of the DML chip. This package structure substantially eliminates any usage of wirebonds between the driver and the DML chip and minimizes effect of inductance of the wirebond to cause distortion of eye diagram of the modulated laser signals generated by the DML chip in the photonics module.

Figure 7:
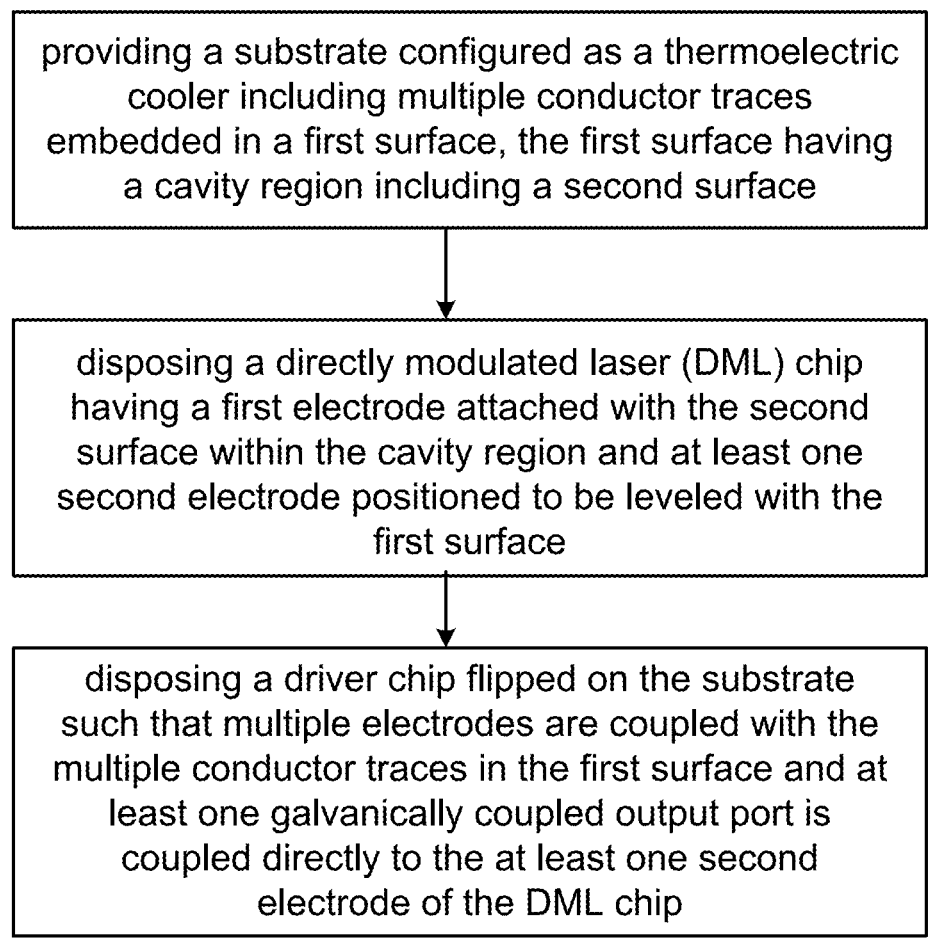
FIG. 7 is a flow chart illustrating a method of packaging a DML chip in photonics module according to another embodiment of the present invention.

In an alternative embodiment, FIG. 7 shows a method of packaging a DML chip in photonics module according to another embodiment of the present invention. As shown, the method includes a step of providing a substrate configured as a thermoelectric cooler including multiple conductor traces embedded in a first surface. The first surface has a cavity region including a second surface displaced from the first surface by a distance. Additionally, the method includes a step of disposing a directly modulated laser (DML) chip having an electrode attached with the second surface within the cavity region and at least one second electrode positioned to be leveled with the first surface. Optionally, the DML chip includes a common electrode being attached to the second surface which is configured to be a cool surface of the thermoelectric cooler associated with the substrate. Optionally, the DML chip includes multiple laser diodes having separate second electrodes all positioned to be leveled with the first surface of the substrate. Moreover, the method includes a step of disposing a driver chip flipped on the substrate such that multiple electrodes are coupled with the multiple conductor traces in the first surface and at least one galvanically coupled output port is coupled directly to the at least one second electrode of the DML chip. This package structure substantially eliminates any usage of wirebonds between the driver and the DML chip so as to eliminate the source of noises induced by inductance of wirebond that affect the transmission of modulated laser signals generated by the DML chip in the photonics module.

Optionally, the DML chip on a thermoelectric cooler coupled with its driver directly or with interposer without any wirebonds can be installed in a TEC-TOSA laser device. Optionally, the DML chip is packaged in a photonics transceiver module configured in a compact Quad Small Form-factor Pluggable (QSFP) packaging specification. Optionally, the package structure of the DML chip can be applied in many other applications of optical communication involving a photonics module.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A package structure of a directly modulated laser in a photonics module comprising:
    a substrate configured with a first surface including multiple conductor traces embedded therein and a second surface configured to be attached on a cool surface of a thermoelectric cooler including one or more conductor trances in the cool surface, the substrate having a cavity region formed from the first surface down to expose a portion of the cool a surface;
    a directly modulated laser (DML) chip having at least a first electrode attached to the one or more conductor traces in the cool surface within the cavity region and at least one second electrode positioned to be leveled with the first surface; and
    a driver chip flipped and disposed on the substrate, the driver chip including multiple electrodes configured to be coupled with the multiple conductor traces in the first surface and including at least one galvanically coupled output port to be coupled directly to the at least one second electrode of the DML chip.

2. The package structure of claim 1 wherein the substrate comprises silicon and silicon oxide, each of the multiple conductor traces is configured to carry electrical signals interfacing with the driver chip.

3. The package structure of claim 2 wherein the one or more conductor traces in the cool surface is configured as an electrical ground of the thermoelectric cooler, the substrate comprises at least one trans-silicon via filled with conductor to form a contact electrode on the first surface connecting at least one of the one or more conductor traces in the cool surface for grounding the electrical ground of the thermoelectric cooler.

4. The package structure of claim 3 wherein the DML chip comprises multiple laser diodes having a common electrode being attached with the cool surface to connect to the electrical ground with a thermal conductive pad inserted between the common electrode and the cool surface.

5. The package structure of claim 4 wherein the multiple laser diodes comprise respective multiple second electrodes, and the driver chip comprises multiple galvanically coupled output ports coupled to the respective multiple second electrodes of the DML chip.

* * * * *